US006855624B1

United States Patent
Zarkesh-Ha et al.

(10) Patent No.: US 6,855,624 B1
(45) Date of Patent: Feb. 15, 2005

(54) LOW-LOSS ON-CHIP TRANSMISSION LINE FOR INTEGRATED CIRCUIT STRUCTURES AND METHOD OF MANUFACTURE

(75) Inventors: Payman Zarkesh-Ha, Freemont, CA (US); Kenneth J. Doniger, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 21 days.

(21) Appl. No.: 10/245,219

(22) Filed: Sep. 17, 2002

(51) Int. Cl.[7] .......................................... H01L 21/4763
(52) U.S. Cl. ...................................... 438/622; 438/674
(58) Field of Search .............................. 438/622, 624, 438/642, 652, 674

(56) References Cited

U.S. PATENT DOCUMENTS

| | | | |
|---|---|---|---|
| 5,115,245 A | * | 5/1992 | Wen et al. .................... 342/175 |
| 5,521,563 A | * | 5/1996 | Mazzochette ................ 333/116 |
| 5,644,277 A | * | 7/1997 | Gulick et al. ................ 333/246 |
| 6,037,262 A | | 3/2000 | Hsia et al. |
| 6,060,954 A | * | 5/2000 | Liu et al. ....................... 331/99 |
| 6,174,798 B1 | | 1/2001 | Hsia et al. |
| 6,189,131 B1 | | 2/2001 | Graef et al. |
| 6,239,491 B1 | | 5/2001 | Pasch et al. |
| 6,303,995 B1 | | 10/2001 | Kapoor et al. |
| 6,420,778 B1 | * | 7/2002 | Sinyansky ................... 257/664 |

* cited by examiner

Primary Examiner—Phuc T. Dang
(74) Attorney, Agent, or Firm—Maginot, Moore & Beck

(57) ABSTRACT

A transmission line for an integrated circuit (IC) is composed of an assemblage of connected, individual transmission line portions. According to one embodiment, the transmission line assemblage includes two or more (i.e. a plurality of) vertically disposed, electrically connected, individual transmission line portions. Each transmission line portion is electrically connected to a vertically adjacent transmission line portion. Preferably, each transmission line portion is formed in a separate layer of the IC with connections between the transmission line portions formed by vias. As such, the subject transmission tine exhibits a low capacitance and a characteristic impedance that is easily driven. In another form, the subject invention is a system, process and/or apparatus for forming a transmission line on an integrated circuit (i.e. an on-chip transmission line). The transmission line is formed of an assemblage of connected, individual transmission lines such as those described above.

14 Claims, 6 Drawing Sheets

LOW-LOSS ON-CHIP TRANSMISSION LINE FOR INTEGRATED CIRCUIT STRUCTURES AND METHOD OF MANUFACTURE

BACKGROUND

1. Field of the Invention

The subject invention relates generally to fabrication of components on integrated circuit structures and, more specifically, to the fabrication and structure of transmission lines in integrated circuit structures.

2. Background Information

Integrated circuits have become key components of many consumer and commercial electronic products, often replacing discrete components and enhancing product functionality. The semiconductor processing technologies that produce these integrated circuits have advanced to the point where complete systems can now be reduced to a single integrated circuit or application specific integrated circuit (ASIC) device. These integrated circuits or "chips" may incorporate many functions that previously could not be implemented together on a single chip, including but not limited to: microprocessors, digital signal processors, mixed signal and analog functions, large blocks of memory and high speed interfaces. The requisite level of integration, however, significantly complicates the design and manufacturing processes.

In the formation of integrated circuit structures, one or more patterned metal layers or ginterconnects" are formed between insulation layers, e.g. between silicon oxide layers. Typically, each of such patterned metal layers or interconnects actually comprises a sandwich of several electrically conductive layers including a main metal layer. The main metal layer usually comprises an aluminum layer or a layer of an aluminum alloy, such as an aluminum/copper (Al—Cu) alloy or an aluminum/copper/silicon (Al—Cu—Si) alloy. This main layer, which is principally selected for its conductivity, is typically sandwiched in between a thin lower layer of titanium and thin upper layers of titanium and titanium nitride. These thin layers are relatively hard, compared to the main layer, and serve to prevent vertical deformation of the aluminum-containing main layer during subsequent processing, especially during thermal processing such as annealing.

Interconnects are used to connect the various individual components such as transistors with one on another. The individual components are typically in a component array or block. These interconnects are known as local interconnects. Local interconnects are very short in length since the connection distance between components is very short. Therefore, signal delay through such interconnects is not a limiting factor in the system performance. The cross section of a local interconnect is very small. An IC, however, has a great number of local interconnects (on the order of about 80% of all interconnects) since an IC has a great number of components.

Another form of interconnect is a global interconnect. The global interconnect provides interconnection between the component arrays or blocks. Global interconnects are fairly long in length as compared to local interconnects. As well, the cross section of a global interconnect is large. An IC has a small number of global interconnects (on the order of about 20% of all interconnects) since an IC has a small number of component blocks as compared to components.

It is necessary within ICs to provide high speed connection lines between the various component blocks. Clock lines are necessarily high speed. Global interconnects may be used as high speed connections. Such global interconnects, however, have a high power loss due to their inherent geometry.

High speed is achieved by making interconnects into transmission lines. Again, unfortunately, the geometry of on-chip transmission lines leads to large resistances and, therefore, large power losses. In view of this, transmission lines may be made off-chip rather than on-chip. Off-chip transmission lines provide a lowering of power loss while preserving speed. Off-chip transmission lines, however, are expensive and necessitate connections to and from the chip. This can lead to testing difficulties and reliability issues.

What is therefore needed in view of the above, is an on-chip transmission line that alleviates the shortcomings of the prior art.

What is therefore further needed in view of the above, is a low-loss on-chip transmission line that retains a characteristic impedance of a current transmission line for an IC.

What is therefore further needed in view of the above, is a system, method and/or apparatus for fabricating a low-loss on-chip transmission line having a characteristic impedance of a current transmission line for an IC.

SUMMARY

In one form, the subject invention is a transmission line that is formed on an integrated circuit (i.e. an on-chip transmission line). The on-chip transmission line is composed of an assemblage of connected, individual transmission line portions. Each individual transmission line portion thus forms a part of the transmission line assemblage.

According to one embodiment, the transmission line assemblage includes two or more (i.e. a plurality of) vertically disposed, electrically connected, individual transmission line portions. Each transmission line portion is electrically connected to a vertically adjacent transmission line portion.

Preferably, each transmission line portion is formed in a separate layer of the IC with connections between the transmission line portions formed by vias. As such, the subject transmission line exhibits a low capacitance and a characteristic impedance that is easily driven.

In another form, the subject invention is a system, process and/or apparatus for forming a transmission line on an integrated circuit (i.e. an on-chip transmission line). The transmission line is formed of an assemblage of connected, individual transmission lines such as those described above.

In one form thereof, the subject invention provides a method of fabricating a transmission line on an integrated circuit. The method includes (a) providing a substrate; and (b) forming a plurality of electrically connected transmission line portions in a plurality of layers on the substrate.

In another form thereof, the subject invention provides an integrated circuit having a substrate, and a transmission line disposed on the substrate and formed of a plurality of electrically connected transmission line portions.

In yet another form thereof, the subject invention provides an integrated circuit having a substrate, a plurality of components disposed on the substrate, and a transmission line disposed on the substrate and in communication with at least one of the components. The transmission line is formed of a first transmission line portion in a first layer on the substrate, a second transmission line portion in a second layer on the substrate and vertically disposed relative to the first transmission line portion, and an electrical connector in a third layer on the substrate adjacent the first and second layers. The electrical connector electrically couples the first transmission line portion to the second transmission line portion.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views.

DESCRIPTION OF THE PREFERRED EMBODIMENT(S)

Figure 1:
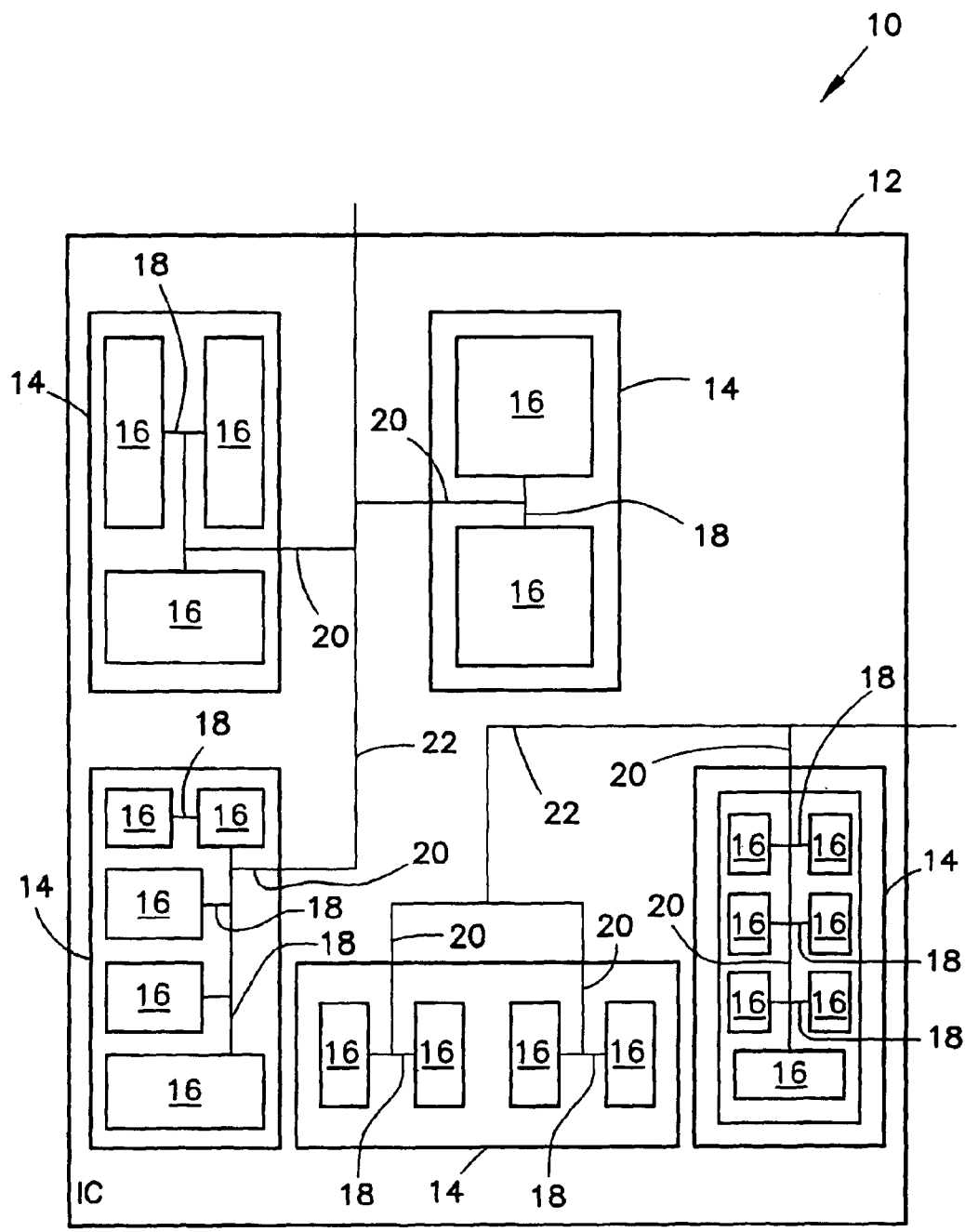
FIG. 1 is simplified block diagram of an exemplary integrated circuit (IC) having at least one transmission line composed and/or formed in accordance with the principles of the subject invention.

With reference now to FIG. 1, there is shown a simplified block diagram of an integrated circuit (IC) or chip generally designated 10. The IC 10 is characterized by a substrate 12 that is typically silicon, however, other material or materials may be used. The substrate 12 has a plurality of component blocks 14 each of which has a plurality of components 16. It should be appreciated that the number of component blocks 14 shown on the substrate 12 of the IC 10 of FIG. 1 is arbitrary with respect to the principles of the subject invention, and are thus illustratively. As well, the number of components 16 within the component blocks 14 is arbitrary with respect to the principles of the subject invention. Typically, the number of component blocks 14 and/or components 16 within each component block 14 varies with the type and/or purpose of the IC. The components 16 may be transistors, capacitors, memory cells, and/or the like. The various components 16 are fabricated according to known methods.

The components 16 are connected to other components by local interconnects 18. As indicated above, local interconnects are typically very short in connecting length and have a very small cross section. Because of the sheer number of components (e.g. a microprocessor has millions of transistors) on an IC, local interconnects 18 typically comprise roughly 80% of the total number of interconnects (not including transmission lines) in an IC.

The local interconnects 18 are connected via global interconnects 20 to groups of components 16 connected to each other by local interconnects 18, and to the various component blocks 14. As indicated above, global interconnects 20 are longer in connection length than local interconnects 16 and have a larger cross section. This is because global interconnects 20 must be able to handle greater loads than local interconnects 18. As well, global interconnects 20 make up the remaining 20% of the total number of interconnects (not including transmission lines) in an IC.

Additionally, while it would appear from FIG. 1 that the various component blocks 14, components 16, local interconnects 18, and/or global interconnects 20 (collectively, "IC components") are in the same plane as the substrate 12, it should be appreciated to one skilled in the art that such IC components are fabricated in different layers of the IC 10. The fabrication of such IC components is accomplished as is known in the art.

The IC 10 also includes at least one transmission line 22, of which two transmission lines 22 are shown. The IC 10 typically includes only a limited number of transmission lines 22 as compared to the number of local and global interconnects. The transmission lines 22 connect to or with the various global interconnects 20.

The transmission lines 22 are typically long as compared to the global interconnects 20 and very long as compared to the local interconnects 18. The cross sectional area of the transmission lines 22 is also large as compared to the cross sectional area of the local interconnects 18 and very large as compared to the cross sectional area of the global interconnects 20. The transmission lines 22 also have a defined or characteristic impedance. This defined or characteristic impedance allows for easy driving of signals across the transmission line. Additionally, the geometry and/or configuration of the transmission line 22 as provided herein in accordance with the present principles provides a low capacitance.

Figure 2:
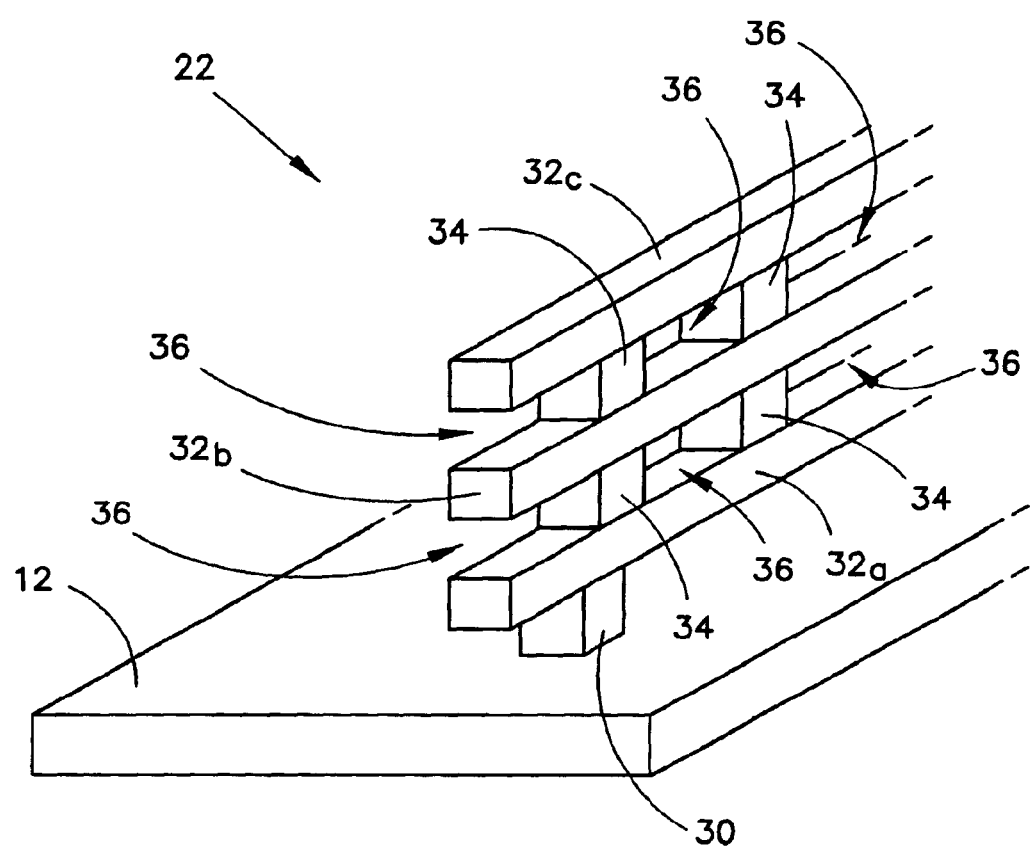
FIG. 2 is an enlarged portion of the integrated circuit of FIG. 1 showing an exaggerated depiction of a transmission line fabricated in accordance with the principles of the subject invention.

Referring to FIG. 2 there is shown an enlarged illustration of a portion of one of the transmission lines 22 in accordance with the principles of the subject invention. It should initially be appreciated that FIG. 2 shows a transmission line 22 only for clarity and simplification, and then only a portion of the transmission line 22. Other IC components are not shown.

In general, the transmission line 22 is composed of two or more (i.e. a plurality) of transmission line portions 32 of which three transmission line portions 32a, 32b and 32c are shown. Preferably, but not necessarily, each transmission line portion 32a, 32b and 32c is substantially the same length from a beginning thereof to an end thereof. Each transmission line portion 32a, 32b and 32c is formed of an electrically conducting material such as a metal. Preferably, but not necessarily, each transmission line portion 32a, 32b and 32c is formed of metal, the metal being either copper or aluminum. The type of metal or electrically conducting material typically depends on the process technology utilized to form or fabricate the transmission line portion 32a, 32b and 32c.

The transmission line 22 includes a first transmission line portion 32a that is electrically connected to an electrically conductive contact 30 that is shown emanating from the substrate 12. The contact 30 is in communication with transistors (not shown) implemented in the silicon substrate. As discussed further with respect to FIGS. 4 6, the contact 30 is formed in one layer of the IC 10, while the first transmission line 32a is formed in another layer of the IC 10. While preferably the layer containing the transmission line portion 32a is immediately vertically (with respect to or as viewed from a plane parallel to the larger flat portion of the substrate as depicted) adjacent the layer containing the contact 30, it should be appreciated that the contact 30 and/or the first transmission line 32a may be formed in multiple, vertically adjacent layers of the IC 10. Thus, for example, the contact 30 may vertically span two or more adjacent layers. Alternatively, the transmission line portion 32a may vertically span two or more adjacent layers of the IC 10. Therefore, it is apparent that the thickness of the transmission line portion 32a (and/or the contact 30) may be variable depending on desired attributes or characteristics of the transmission line 22.

A second transmission line portion 32b is disposed at least substantially if not directly vertically adjacent (i.e. above) the first transmission line portion 32a. The second transmission line portion 32b is electrically connected to the first transmission line portion 32a by at least two, one for each end of the line, and preferably a plurality of electrically conductive portions 34. The electrically conductive portions 34 are spaced apart along the longitudinal lengths of the first and second transmission line portions 32a and 32b. The electrically conductive portions 34 are preferably formed of a metal such as aluminum or copper and, more preferably of the same metal or electrically conducting material as the transmission line portions 32. The electrically conductive portions 34 preferably, but not necessarily, fabricated as vias such as that described in U.S. Pat. No. 6,037,262 the specification of which is specifically incorporated by reference herein.

A third transmission line portion 32c is disposed at least substantially if not directly vertically adjacent (i.e. above) the second transmission line portion 32b. The third transmission line portion 32c is electrically connected to the second transmission line portion 32b by at least two, one for each end of the line, and preferably a plurality of electrically conductive portions 34. The electrically conductive portions 34 are spaced apart along the longitudinal lengths of the second and third transmission line portions 32b and 32c. The electrically conductive portions 34 are preferably formed of a metal such as aluminum or copper and, more preferably of the same metal or electrically conducting material as the transmission line portions 32.

Because the electrically conductive portions 34 are longitudinally spaced along the transmission line portions 32, an area 36 is created between each electrically conductive portion 34. The areas 36 are preferably filled with an electrically non-conducting material such as oxide. Of course, other materials may be used.

Figure 3:
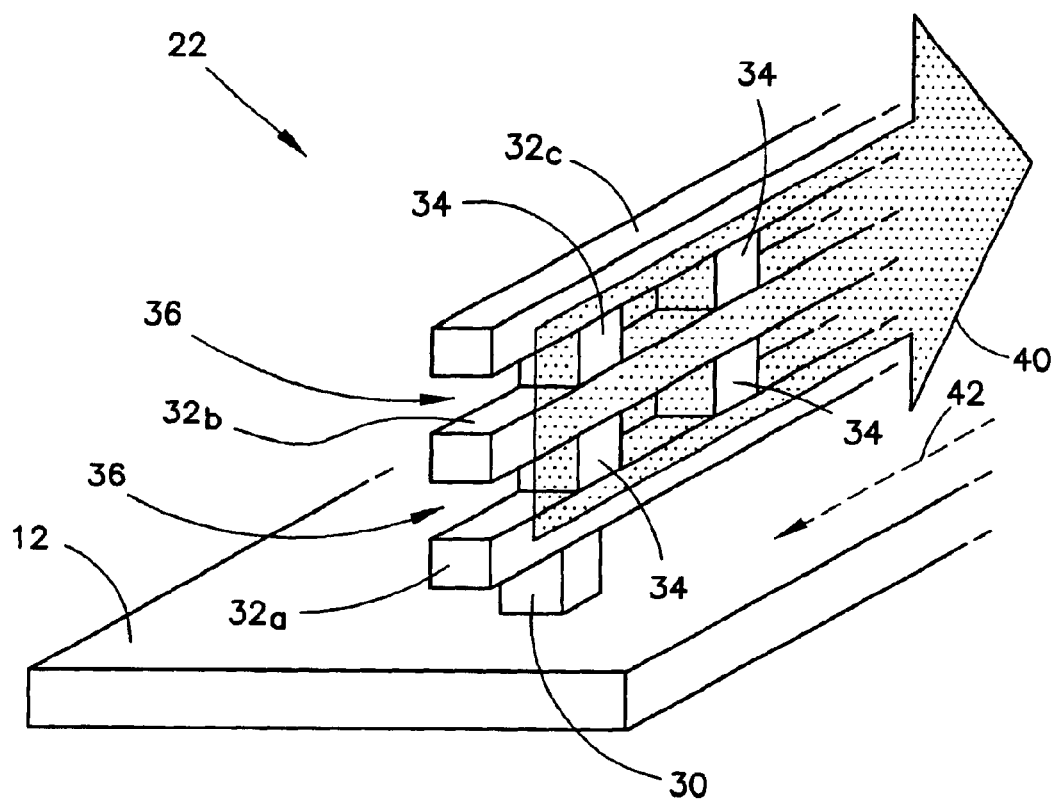
FIG. 3 is the depiction of FIG. 2 illustrating signal flow.

Referring to FIG. 3 there is depicted the transmission line 22 of FIG. 2 with arrows indicating signal direction. Particularly, the arrow 40 indicates signal direction, while the arrow 42 indicates return signal direction. It should be appreciated that the substrate 12 is utilized for the return signal path. The return signal path, however, may utilize a different mode or structure such as on-chip structure and/or component.

Figure 4:
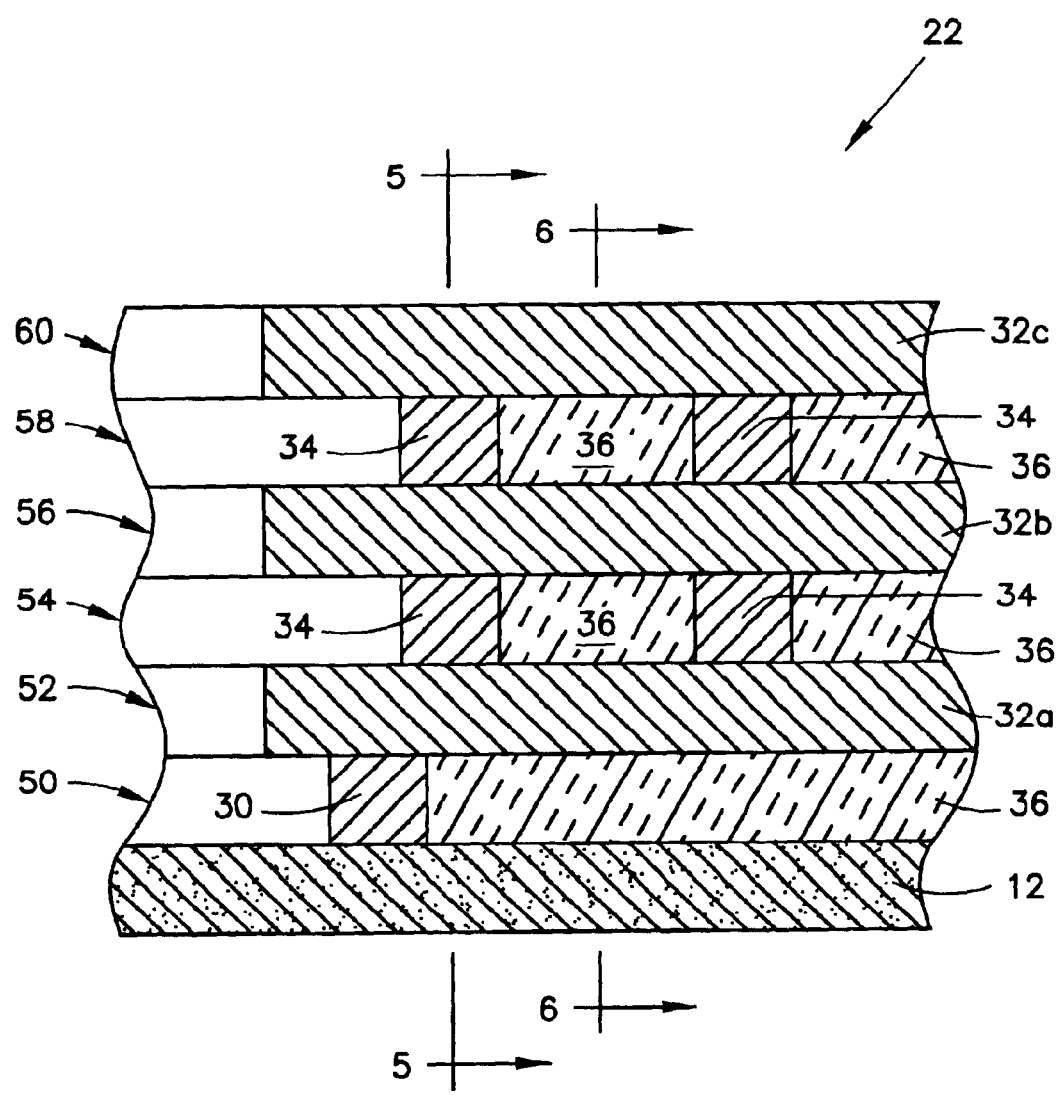
FIG. 4 is a side sectional view of an exemplary integrated circuit having a transmission line composed and/or formed in accordance with the principles of the subject invention.

FIG. 4 depicts the transmission line 22 in a side sectional view particularly illustrating the various transmission line constituents embedded in the various layers of the IC. Particularly, the contact 30 is formed in a first layer 50 on the substrate 12. The transmission line portion 32a is formed in a second layer 52 that is vertically adjacent the first layer 50. The first conductive portions, bridges, paths or the like 34 are disposed in a third layer 54 that is vertically adjacent the second layer 52. The transmission line portion 32b is formed in a fourth layer 56 that is vertically adjacent the third layer 54. The second conductive portions, bridges, paths or the like 34 are disposed in a fifth layer 58 that is vertically adjacent the fourth layer 56. The transmission line portion 32c is formed in a sixth layer 60 that is vertically adjacent the fifth layer 58.

While not shown, it should be appreciated that the various layers 50, 52, 54, 56, 58, 60 contains other IC components as is known in the art. Moreover, the transmission line 22 may consist of additional transmission line portions in additional layers connected by conductive portions 34.

Figure 5:
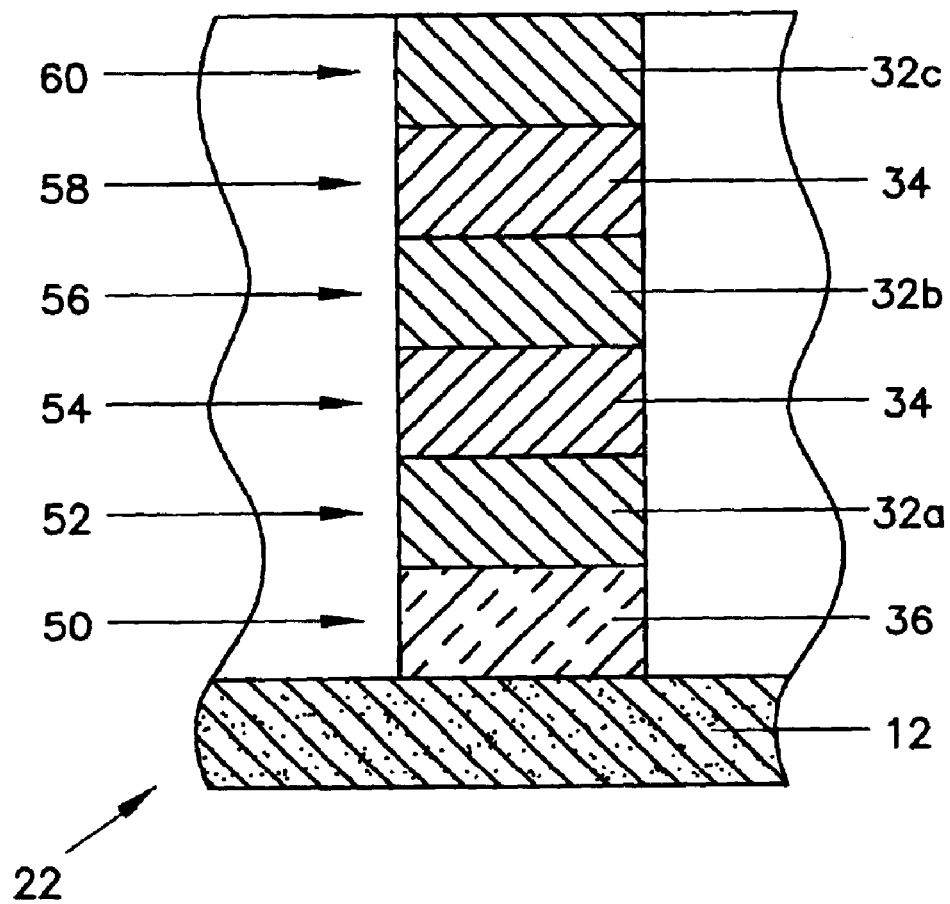
FIG. 5 is a sectional view of the exemplary integrated circuit of FIG. 4 taken along line 5—5 thereof.
Figure 6:
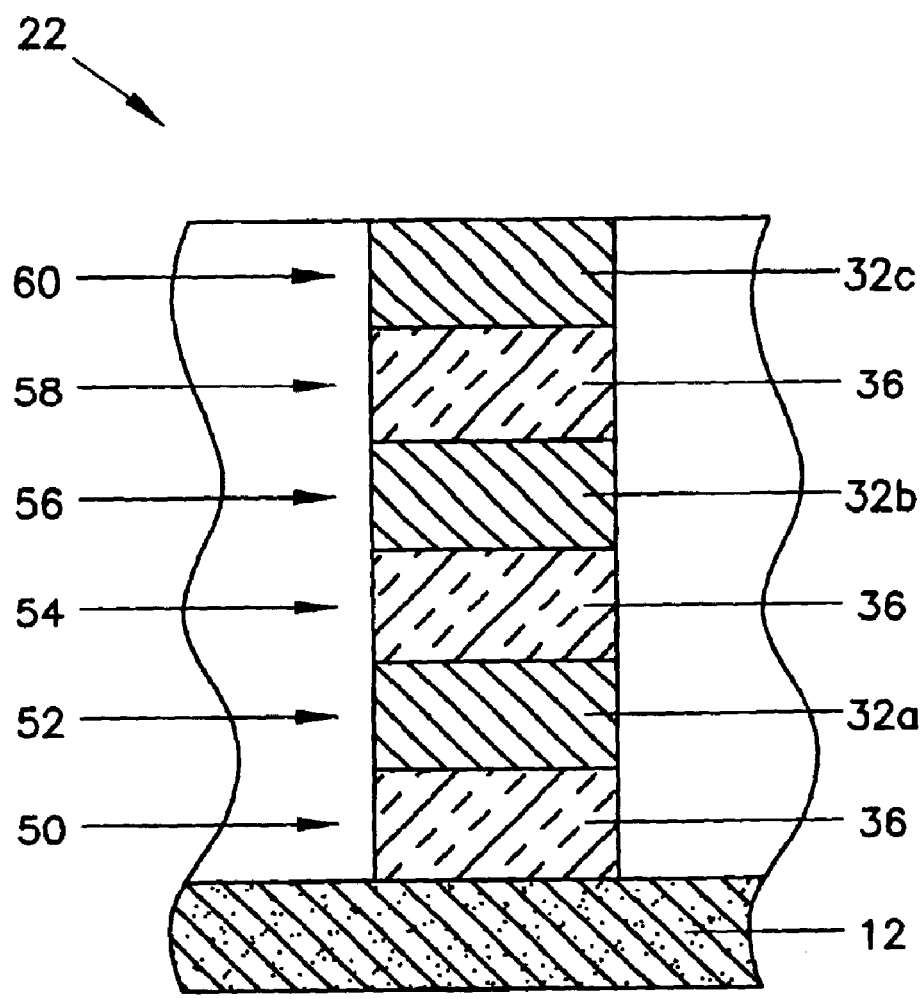
FIG. 6 is a sectional view of the exemplary integrated circuit of FIG. 4 taken along line 6—6 thereof.

FIGS. 5 and 6 illustrate the relationship of the various constituents of the transmission line 22 within the various layers 50, 52, 54, 56, 58, 60 on the substrate 12 of the IC 10 as taken along lines 5—5 and 6—6 respectively of FIG. 4. While the transmission line portions 32a, 32b and 32c are shown aligned vertically, it should be appreciated that the vertical transmission line portions 32a, 32b and 32c, as well as the contact 30 and/or the conductive portions 34, may be skewed horizontally relative to one another. Further, the cross section geometry of the transmission line portions 32a, 32b and 32c do not necessary need to have a rectangular cross section as shown. Other cross sectional geometries may be used. Each transmission line portion 32a, 32b and 32c may be different from adjacent transmission line portions or grouped in various manners, depending on desired operational characteristics.

The dimensions of each portion of the transmission line depends on the process technology used to fabricate the transmission line portions. Each transmission line portion need not be different than the dimensions of any other interconnect, such as is known in the art. In some cases, it may be desirable to vary the width of one transmission line portion relative to another transmission line portion depending on the number of global interconnect connections made to the width varied transmission line portion.

The transmission line portions 32a, 32b and 32c increases the cross sectional area of the transmission line 22 which decreases the resistance of the transmission line 22 while maintaining a desired and/or characteristic impedance at a reasonable value (of about 50 ohms) for the transmission line 22. By distributing the transmission line portions 32a, 32b and 32c over the various layers, capacitance for the transmission line 22 is also reduced. The present transmission line 22 provides a low power loss. Low power loss leads to lower power consumption by the IC. As well, the present on-chip transmission line 22 offers simplicity and improved reliability.

While this invention has been described as having a preferred design and/or configuration, the subject invention can be further modified within the spirit and scope of this disclosure. This application is therefore intended to cover any variations, uses, or adaptations of the invention using its general principles. Further, this application is intended to cover such departures from the subject disclosure as come within known or customary practice in the art to which this invention pertains and which fall within the limits of the appended claims.

What is claimed is:

1. A method of fabricating a transmission line on an integrated circuit comprising:

providing a semiconductor substrate;

forming a first transmission line portion in a first layer on the semiconductor substrate;

forming a first electrical connector in a second layer on the semiconductor substrate, the first electrical connector electrically connected to the first transmission line portion; and forming a second transmission line portion in a third layer on the semiconductor substrate, the second transmission line portion electrically connected to the first electrical connector.

2. The method of claim 1, wherein the first electrical connector is formed in a second layer adjacent the first and third layers.

3. The method of claim 1, wherein the first and second transmission line portions and the electrical connector are formed of the same electrically conductive material.

4. An integrated circuit comprising:

a semiconductor substrate; and a transmission line disposed on said substrate and formed of a plurality of electrically connected transmission line portions, the plurality of electrically connected transmission line portions formed in different layers of the integrated circuit.

5. The integrated circuit of claim 4, wherein said plurality of electrically connected transmission line portions are formed in alternating pairs of layers of transmission line portions and electrical connectors.

6. The integrated circuit of claim 4, wherein said plurality of electrically connected transmission line portions is vertically disposed on said substrate.

7. The integrated circuit of claim 4, wherein said plurality of electrically connected transmission line portions comprise:

alternating adjacent layers of transmission line portions and electrical connectors, the electrical connectors electrically coupling vertically adjacent transmission line portions.

8. The integrated circuit of claim 4, wherein said plurality of electrically connected transmission line portions are fabricated from a metal.

9. The integrated circuit of claim 8, wherein said metal comprises one of copper and aluminum.

10. An integrated circuit comprising:

a substrate;

a plurality of components disposed on said substrate; and a transmission line disposed on said substrate and in communication with at least one of said components, said transmission line formed of a first transmission line portion in a first layer on said substrate, a second transmission line portion in a second layer on said substrate and vertically disposed relative to said first transmission line portion, and an electrical connector in a third layer on said substrate adjacent said first and second layers, said electrical connector electrically connected to said first and second transmission line portions.

11. The integrated circuit of claim 10, wherein said first and second transmission line portions and said electrical connector are fabricated from essentially conductive material.

12. The method of claim 1, wherein:

the substrate has a first side; and the first and second transmission line portions and the electrical connector are formed on the first side on the substrate.

13. The method of claim 1, further comprising the step of forming a contact in a fourth layer on the substrate, wherein the first layer is adjacent the fourth and second layers on the substrate and the first transmission line portion is electrically connected to the contact.

14. The integrated circuit of claim 4, wherein said substrate forms a signal path.

* * * * *